(12) United States Patent  
Wei et al.

(10) Patent No.: US 12,000,873 B2  
(45) Date of Patent: Jun. 4, 2024

(54) POWER TOOL, DETECTION CIRCUIT AND DETECTION METHOD OF LOAD STATE OF POWER TOOL

(71) Applicant: Globe (Jiangsu) Co., Ltd., Changzhou (CN)

(72) Inventors: Zefeng Wei, Changzhou (CN); Biao Li, Changzhou (CN); Xian Zhuang, Changzhou (CN)

(73) Assignee: Globe (Jiangsu) Co., Ltd., Changzhou (CN)

( * ) Notice: Subject to any disclaimer, the term of this patent is extended or adjusted under 35 U.S.C. 154(b) by 197 days.

(21) Appl. No.: 17/686,378

(22) Filed: Mar. 3, 2022

(65) Prior Publication Data

US 2022/0291261 A1 Sep. 15, 2022

(30) Foreign Application Priority Data

Mar. 9, 2021 (CN) .......................... 202110265058.9

(51) Int. Cl.
*H02J 7/00* (2006.01)
*G01R 15/14* (2006.01)
*G01R 19/165* (2006.01)
*G08B 5/36* (2006.01)
*G08B 21/18* (2006.01)
*B23D 59/00* (2006.01)
*H02M 3/00* (2006.01)

(52) U.S. Cl.
CPC ..... *G01R 19/16523* (2013.01); *G01R 15/144* (2013.01); *G08B 5/36* (2013.01); *G08B 21/182* (2013.01); *H02J 7/0047* (2013.01); *H02J 7/0063* (2013.01); *B23D 59/001* (2013.01); *H02J 2207/20* (2020.01); *H02M 3/00* (2013.01)

(58) Field of Classification Search
CPC ...... H02J 7/0029; H02J 7/0304; H02J 7/0306; H02J 7/0308
See application file for complete search history.

(56) References Cited

U.S. PATENT DOCUMENTS

| 5,552,684 | A | * | 9/1996 | Wada | ................. | B62D 5/0487 |
| | | | | | | 361/33 |
| 5,844,398 | A | * | 12/1998 | Kwan | ................. | H01M 10/46 |
| | | | | | | 320/123 |
| 2019/0262960 | A1 | | 8/2019 | Lamont et al. | | |

FOREIGN PATENT DOCUMENTS

| CN | 1842388 | A | 10/2006 | | |
| CN | 104181419 | A | 12/2014 | | |
| CN | 110672911 | A | 1/2020 | | |
| CN | 111384877 | A | 7/2020 | | |
| CN | 111446697 | A | 7/2020 | | |
| CN | 212304726 | U | 1/2021 | | |
| EP | 2713504 | A2 * | 4/2014 | ............... | B25F 5/00 |

(Continued)

*Primary Examiner* — Benyam Haile

(57) ABSTRACT

The disclosure provides a power tool, a detection circuit and a detection method of a load state thereof. The detection circuit of the power tool includes: a main control unit, a sampling resistor, a voltage sampling unit and an alarm display unit. The sampling resistor is arranged on a driving loop of a motor. The voltage sampling unit is used to sample a voltage across the sampling resistor. The alarm display unit is connected with the main control unit. The main control unit is configured to control the alarm display unit to execute a preset display state according to a voltage signal across the sampling resistor sampled by the voltage sampling unit.

14 Claims, 2 Drawing Sheets

(56) References Cited

FOREIGN PATENT DOCUMENTS

| | | | | |
|---|---|---|---|---|
| EP | 2897250 | A1 | 7/2015 | |
| JP | 59169387 | A * | 9/1984 | ............. B23Q 15/12 |
| JP | 2005074559 | A | 3/2005 | |

* cited by examiner

POWER TOOL, DETECTION CIRCUIT AND DETECTION METHOD OF LOAD STATE OF POWER TOOL

CROSS REFERENCE TO RELATED APPLICATION

The present application is based on, and claims the priority from, Chinese application number CN202110265058.9, filed on Mar. 9, 2021, the disclosure of which is hereby incorporated by reference herein in its entirety.

TECHNICAL FIELD

The disclosure relates to a technical field of a detection of a load state, specifically to a power tool, a detection circuit and detection method of a load state of a power tool.

BACKGROUND

In a design of the alarm mechanism of the current cutting saw or chain saw, LED lights are mostly used to realize an abnormal alarm function, or some products have no such function at all. During a cutting process, the machine will automatically stop and alarm after an overcurrent, blocked rotor or undervoltage, or overtemperature protection function. On one hand, a magnitude of the current load during the cutting process cannot be predicted in advance, and the cutting will continue until the overcurrent protection stops. On the other hand, if the current cutting saw or chain saw is often shut down due to overcurrent during the cutting process, a temperature of the motor coil will rise faster, and it will also cause overtemperature protection, which affects a cutting experience and other aspects.

SUMMARY

The disclosure provides a power tool, a detection circuit and detection method of a load state of a power tool, which is used to solve a problem that in the conventional art, a magnitude of the current load during a cutting process of the power tool cannot be predicted in advance, and an overtemperature protection is caused by an overcurrent shutdown during the cutting process of the power tool which enables a temperature of a motor coil to rise faster, which affects a cutting experience and other aspects.

The disclosure provides a detection circuit of a load state of a power tool. The detection circuit of the load state of the power tool includes a main control unit, a sampling resistor, a voltage sampling unit and an alarm display unit. The sampling resistor is arranged on a driving loop of a motor. The voltage sampling unit is used to sample a voltage across the sampling resistor. The alarm display unit is connected with the main control unit. The main control unit is configured to control the alarm display unit to execute a preset display state according to a voltage signal across the sampling resistor sampled by the voltage sampling unit.

In an alternative embodiment, the detection circuit of the load state of the power tool further includes a second direct current power source, the second direct current power source is respectively connected with power supply terminals of the main control unit, the voltage sampling unit and the alarm display unit.

In an alternative embodiment, the second direct current power source is connected with a first direct current power source, the first direct current power source is configured as a driving power source of the power tool, and the first direct current power source is configured to supply power to the second direct current power source.

In an alternative embodiment, the first direct current power source includes a battery pack.

In an alternative embodiment, the second direct current power source includes a DC-DC unit.

In an alternative embodiment, one end of the sampling resistor is connected with a negative electrode of a motor driving unit, the other end of the sampling resistor is connected with a negative electrode of the first direct current power source, and a positive electrode of the motor driving unit is connected with a positive electrode of the first direct current power source.

In an alternative embodiment, the alarm display unit includes a resistor R1 and a light-emitting diode LED1, one end of the resistor R1 is connected with the second direct current power source, the other end of the resistor R1 is connected with an anode of the light-emitting diode LED1, and a cathode of the light-emitting diode LED1 is connected with the main control unit.

In an alternative embodiment, the main control unit includes an operational amplifier.

In an alternative embodiment, the voltage sampling unit comprises a resistor R2, a resistor R3, a resistor R4, a resistor R5, a resistor R6, a capacitor C2 and a capacitor C3, one end of the resistor R2 is connected with the second direct current power source, and the other end of the resistor R2 is respectively connected with a positive end of the operational amplifier, one end of the resistor R3 and one end of the capacitor C3, the other end of the resistor R3 is respectively connected with one end of the sampling resistor and a negative electrode of a motor driving unit, the other end of the capacitor C3 is respectively connected with a negative end of the operational amplifier, one end of the resistor R4 and one end of the resistor R5, the other end of the resistor R4 is respectively connected with the other end of the sampling resistor and a negative electrode of the first direct current power source, the other end of the resistor R5 is respectively connected with an operational amplifier output end of the operational amplifier and one end of the resistor R6, the other end of the resistor R6 is respectively connected with an input or output port of the main control unit and one end of the capacitor C2, and the other end of the capacitor C2 is grounded.

In an alternative embodiment, the main control unit is configured to obtain a load current of the power tool according to the voltage signal across the sampling resistor collected by the voltage sampling unit; determine the load state of the power tool according to an obtained magnitude of the load current of the power tool; and determine duration time of a current load state of the power tool, when the duration time of the current load state of the power tool is greater than or equal to a preset time, controlling the alarm display unit to execute a preset display state corresponding to the current load state of the power tool.

The disclosure further provides a detection method of a load state of a power tool. The detection method of the load state of the power tool includes: obtaining a load current of the power tool by detecting a voltage across the sampling resistor; determining the load state of the power tool according to an obtained magnitude of the load current of the power tool; and determining duration time of a current load state of the power tool, when the duration time of the current load state of the power tool is greater than or equal to a preset time, controlling an alarm display unit to execute a preset display state corresponding to the current load state of the power tool.

In an alternative embodiment, a value of the load current is defined as a reference current value when the power tool is overloaded. The operation of determining the load state of the power tool according to the obtained magnitude of the load current of the power tool includes: determining the load state of the power tool according to a proportional range of the value of the load current of the power tool to the reference current value.

In an alternative embodiment, The operation of determining the load state of the power tool according to the proportional range of the value of the load current of the power tool to the reference current value includes: defining the load state of the power tool as a first load state when the value of the load current of the power tool is greater than or equal to the reference current value; defining the load state of the power tool as a second load state when the value of the load current of the power tool is greater than or equal to a first preset current value and less than the reference current value; defining the load state of the power tool as a third load state when the value of the load current of the power tool is greater than or equal to a second preset current value of the reference current value and less than the first preset current value; and defining the load state of the power tool as a fourth load state when the load current of the power tool is less than the second preset current value of the reference current value.

In an alternative embodiment, the first preset current value is set from 85% to 95% of the reference current value, and the second preset current value is set from 75% to 85% of the reference current value.

In an alternative embodiment, the first preset current value is set to 90% of the reference current value, and the second preset current value is set to 80% of the reference current value.

The disclosure further provides a power tool. The power tool includes a body, a motor, a motor driving unit, and the detection circuit of the load state of the power tool mentioned above. The motor and the motor driving unit are arranged on the body. The detection circuit is arranged on the body.

In an alternative embodiment, the power tool includes a cutting saw or a chain saw.

The power tool, the detection circuit and detection method of the load state of the power tool can intuitively remind a user of a magnitude of a load current during a use of the power tool, and maintain a consistency of the relative cutting, which improves a use of a product, enables the user to be more satisfied, and comprehensively improves a competitiveness of the product.

DETAILED DESCRIPTION

The embodiments of the disclosure are described below through specific examples, and those skilled in the art may easily understand other advantages and effects of the disclosure from contents disclosed in this specification. The disclosure may also be implemented or applied through other different specific embodiments, and various details in this specification may also be modified or changed based on different viewpoints and applications without departing from the scope of the disclosure.

Figure 1:
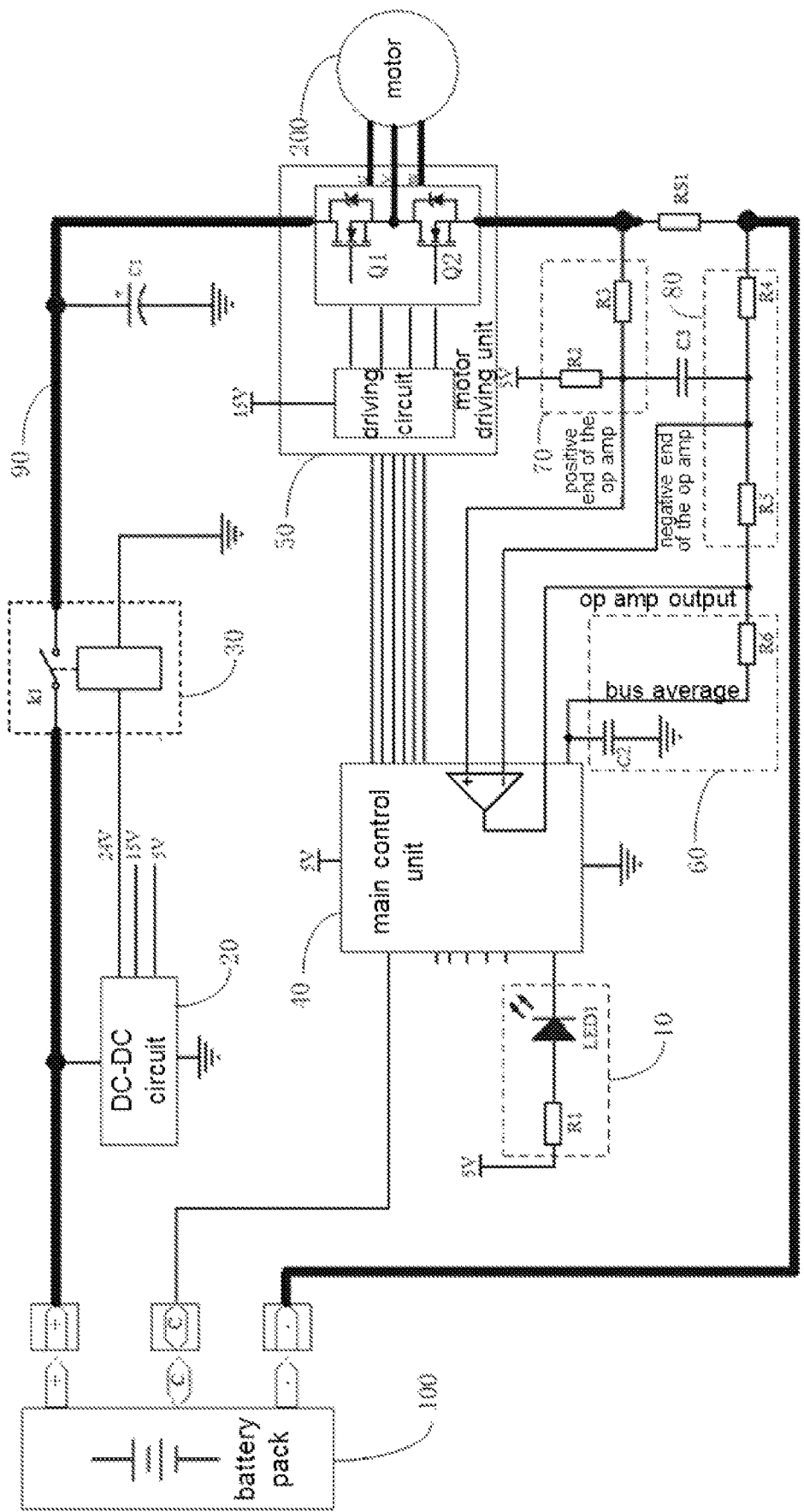
FIG. 1 is a circuit diagram of a detection circuit of a load state of a power tool according to an embodiment of the disclosure.
Figure 2:
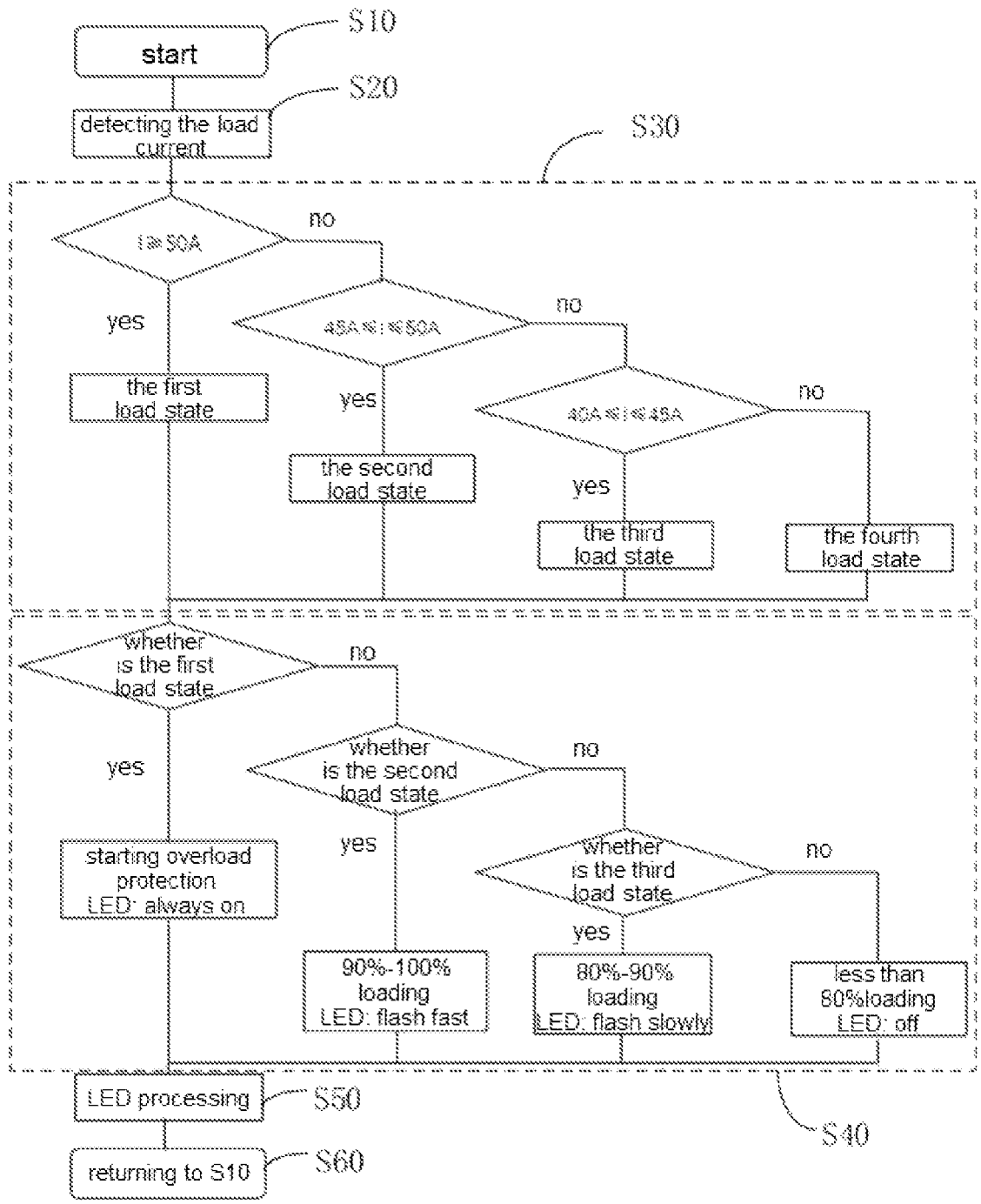
FIG. 2 is a schematic flowchart of a detection method of a load state of a power tool according to an embodiment of the disclosure.

Please refer to FIG. 1 and FIG. 2. It should be noted that drawings provided in the embodiments are only illustrative of a basic idea of the disclosure. The drawings only show assemblies related to the disclosure instead of drawing according to the number, shape and size of the assemblies in actual implementation. In actual implementation, the type, quantity and ratio of each assembly may be changed at will, and a layout of the assemblies may also be more complicated.

A power tool usually includes a body, a motor, a motor driving unit and a driving loop of the motor. The motor, motor driving unit and the driving loop are arranged on the body. In order to solve technical problems that the power tool cannot predict in advance a magnitude of a current load during a cutting process of the power tool, and an over-temperature protection caused by an over-current shutdown during the cutting process of the power tool causing a temperature of the motor coil to rise faster, thereby affecting a cutting feel and other experience, please refer to FIG. 1. The disclosure provides a detection circuit of a load state of the power tool, which may be arranged on the body of the power tool. The detection circuit of the load state of the power tool includes a main control unit 40, a sampling resistor RS1, a voltage sampling unit and an alarm display unit 10. The sampling resistor RS1 is arranged on the driving loop 90 of the motor 200 of the power tool. The voltage sampling unit is arranged on both ends of the sampling resistor RS1 to sample a voltage across the sampling resistor. The alarm display unit 10 is connected with the main control unit 40. The main control unit 40 is configured to control the alarm display unit 10 to execute a preset display state according to a received voltage signal across the sampling resistor RS1 sampled by the voltage sampling unit. In one embodiment, the main control unit 40 is configured to obtain a load current of the power tool by using the received voltage signal collected by the voltage sampling unit according to a preset logic, to determine the load state of the power tool according to the obtained load current of the power tool, to determine a duration time of the current load state of the power tool, and to control the alarm display unit 10 to execute the preset display state corresponding to the current load state of the power tool when the duration time of the current load state of the power tool is greater than or equal to a preset time. The detection circuit of the load state of the power tool of the disclosure can intuitively remind a user of a magnitude of a load current during a use of the power tool, maintain a consistency of the relative cutting and improve a use of a product, which enables the user to be more satisfied, and comprehensively improves a competitiveness of the product. As an example, the power tool may be, for example, a hand-held power tool such as a cutting saw or a chain saw.

Please refer to FIG. 1. The detection circuit of the load state of the power tool of the disclosure further includes a DC-DC circuit as a second direct current power source 20. The DC-DC circuit is connected with a first direct current power source 100 which is configured as a driving power source of the power tool. The first direct current power source 100 supplies power to the DC-DC circuit. The DC-DC circuit converts direct current outputs of the first direct current power source 100 into direct current voltages (such as 5V, 15V, and 24V in FIG. 1) required by different power consumption units to supply power to each power consumption unit in the detection circuit of the load state of the power tool. In other words, output terminals of the DC-DC circuit are respectively connected with the main control unit 40, the voltage sampling unit, the alarm display unit 10 and power supply terminals of a contactor 30 and a motor driving unit 50 to be described below. It may be understood that, in other embodiments, the DC-DC circuit may also be powered by other direct current power sources. As an example, the first direct current power source 100 mentioned above may be, for example, a battery pack. The battery pack may be, for example, a secondary battery (battery) such as a nickel-metal hydride battery or a lithium-ion battery, an electric double layer capacitor, or the like.

Please refer to FIG. 1. In the detection circuit of the load state of the power tool of the disclosure, one end of the sampling resistor RS1 is connected with a negative side of the motor driving unit 50, and the other end of the sampling resistor RS1 is connected with a negative electrode of the first direct current power source 100. A positive side of the motor driving unit 50 is connected with a positive electrode of the first direct current power source 100.

Please refer to FIG. 1. In the detection circuit of the load state of the power tool of the disclosure, the alarm display unit 10 includes a resistor R1 and a light-emitting diode LED1. One end of the resistor R1 is connected with the second direct current power source 20, the other end of the resistor R1 is connected with an anode of the light-emitting diode LED1, and a cathode of the light-emitting diode LED1 is connected with the main control unit 40.

Please refer to FIG. 1. In an embodiment, the detection circuit of the load state of the power tool of the disclosure includes a main control unit 40 and a sampling resistor RS1. A resistor R2 and a resistor R3 define a bias circuit 70. A resistor R4 and a resistor R5 define an operational feedback amplifier circuit 80. A capacitor C3 is defined as a filter capacitor. A resistor R6 and a capacitor C2 define an RC filter circuit 60. The resistor R1 and light-emitting diode LED1 define an alarm display unit 10. Wherein, the bias circuit 70 defined by the resistor R2 and resistor R3, the operational feedback amplifier circuit 80 defined by the resistor R4 and resistor R5, the capacitor C3, and the RC filter circuit 60 defined by the resistor R6 and capacitor C2 together define a voltage sampling unit. In an embodiment, the main control unit includes an operational amplifier. One end of the resistor R2 is connected with the second direct current power source 20, and the other end of the resistor R2 is respectively connected with a positive end of the operational amplifier (op amp for short in FIG. 1), one end of the resistor R3 and one end of the capacitor C3. The other end of the resistor R3 is respectively connected with one end of the sampling resistor RS1 and the negative side of the motor driving unit 50. The other end of the capacitor C3 is respectively connected with a negative end of the operational amplifier, one end of the resistor R4 and one end of the resistor R5. The other end of the resistor R4 is respectively connected with the other end of the sampling resistor RS1 and the negative electrode of the first direct current power source 100. The other end of the resistor R5 is connected with the output end of the operational amplifier and one end of the resistor R6. The other end of the resistor R6 is respectively connected with an input or output port of the main control unit and one end of the capacitor C2, and the other end of the capacitor C2 is grounded. One end of the resistor R1 is connected with the second direct current power source 20, and the other end of the resistor R1 is connected with the anode of the light-emitting diode LED1. The cathode of the light-emitting diode LED1 is connected with the main control unit 40.

A working mechanism of the detection circuit of the load state of power tool of the disclosure will be described in detail below with reference to FIG. 1.

When the battery pack (as the first direct current power source 100) is inserted, a positive electrode of the battery pack supplies power to the DC-DC circuit (as the second direct current power source 20) inside a device. The DC-DC circuit generates 24V, 15V, 5V and other voltages to supply the voltages to the main control unit 40, the motor driving unit 50, the relay K1 (as the contactor 30), etc., so as to drive the motor 200 to work. At this time, a working load current flows through the sampling resistor RS1 and returns to a negative ground end of the battery pack to define a working loop. In this way, the main control unit 40 may implement a defined internal logic, the logic being configured to implement a detection method of the load state of the power tool to be introduced below (the internal logic may be defined, for example, according to conditions in Table 1), to determine the load state of the power tool through a detection result of the sampling resistor RS1 and control the alarm display unit 10 to execute the preset display state corresponding to the current load state of the power tool according to the load state. Wherein, in FIG. 1, the relay K1 is connected on a line between the positive electrode of the battery pack as the first direct current power source 100 and the positive side of the motor driving unit 50, and is used to control a on/off state between the battery pack and the motor driving unit 50. In the embodiment shown in FIG. 1, the motor 200 is a three-phase alternative current motor. The motor driving unit 50 is connected with the main control unit 40. The motor drive unit 50 includes an inverter, the inverter including a driving circuit and a power transistor (which may be an NMOS transistor or a PMOS transistor). In response to a control signal from the main control unit 40, the motor driving unit 50 converts direct current of the battery pack as the first direct current power source 100 into alternative current (3-phase alternative current) in order to drive the motor 200 to work.

TABLE 1

Current value assignment table

| Setting the load current to 50A when overloaded | A reference current value is equal to 50A | Value assignment status | LED status |
|---|---|---|---|
| ≤80% | I < 40A | State 4 | Off |
| 80%-90% | 40A ≤ I < 45A | State 3 | Flash slowly |
| 90%-100% | 45A ≤ I < 50A | State 2 | Flash fast |
| ≥100% | I ≥ 50A | State 1 | On |

Please refer to Table 1 and take 50 A as the reference current value of overload as an example to illustrate:

When a current flowing through the sampling resistor RS1 is below a second preset current value (selected as 80% of the reference current value in Table 1), which means when the flowing current is continuously below 40 A, it corresponds to state 4 (a fourth load state): a voltage generated on the sampling resistor RS1 is amplified by the operational amplifier inside the main control unit 40 and the operational feedback amplifier circuit 80 mainly composed of the resistor R4 and the resistor R5, then is connected to an I/O port (input or output port) of the main control unit 40 via the RC filter circuit 60 mainly composed of the resistor R6 and the capacitor C2 to be processed, since a logical definition in a program stored in the main control unit is prescribe in advance, for example, if the current is less than 40 A and the voltage at both ends of the corresponding sampling resistor RS1 is less than 1V, it is the off signal, when the main control unit 40 receives such a voltage waveform corresponding to the current less than 40 A, a warning light of the light-emitting diode LED1 may be controlled to be off.

When the current flowing through the sampling resistor RS1 is greater than or equal to the second preset current value and less than a first preset current value (selected as 90% of the reference current value in Table 1), which means when the flowing current is from 40 A to 45 A, it corresponds to state 3 (a third load state): the voltage generated on the sampling resistor RS1 is amplified by the operational amplifier inside the main control unit 40 and the operational feedback amplifier circuit 80 mainly composed of the resistor R4 and the resistor R5, then is connected to an I/O port (input or output port) of the main control unit 40 via the RC filter circuit 60 mainly composed of the resistor R6 and the capacitor C2 to be processed, since the logical definition in the program stored in the main control unit is prescribe in advance, for example, the voltage value between the two ends of the sampling resistor RS1 corresponding to the current therethrough from 40 A to 45 A is from 1V to 1.5V, which is defined as a slow flash signal, when the main control unit 40 receives such a voltage waveform which is from 1V to 1.5V corresponding to the current from 40 A to 45 A, the warning light of the light-emitting diode LED1 may be controlled to flash slowly, and a slow flash time interval may be set such as 500 ms.

When the current flowing through the sampling resistor RS1 is greater than the first preset current value and less than the reference current value, which means when the flowing current is from 45 A to 50 A, it corresponds to state 2 (a second load state): the voltage generated on the resistor is amplified by the operational amplifier inside the main control unit 40 and the operational feedback amplifier circuit 80 mainly composed of the resistor R4 and the resistor R5, then is connected to an I/O port (input or output port) of the main control unit 40 via the RC filter circuit 60 mainly composed of the resistor R6 and the capacitor C2 to be processed, since the logical definition in the program stored in the main control unit is prescribe in advance, for example, the voltage value between the two ends of the sampling resistor RS1 corresponding to the current therethrough from 45 A to 50 A is from 1.5V to 2V, which is defined as a fast flash signal, when the main control unit 40 receives such a voltage waveform corresponding to the current from 45 A to 50 A, the warning light of the light-emitting diode LED1 may be controlled to flash fast, and a fast flash time interval may be set such as 200 ms.

Similarly, when the current flowing through the sampling resistor RS1 is in an overload state, which means that when the current flowing through is continuously 50 A, it corresponds to state 1 (a first load state): the logical definition in the program stored in the main control unit is prescribe in advance, for example, the voltage value between the two ends of the sampling resistor RS1 corresponding to the current therethrough from 50 A is 2V, such a voltage is defined as a constant light signal, when the main control unit 40 receives such a voltage waveform corresponding to the current 50 A, the warning light of the light-emitting diode LED1 may be controlled to be always on.

It should be noted that, in other embodiments, the first preset current value and the second preset current value may be set according to actual needs. As an example, the first preset current value may be, for example, from 85% to 95% of the reference current value, such as 85%, 90%, 95%. The second preset current value is set from 75% to 85% of the reference current value, such as 75%, 80%, 85%, and it should ensure that the second preset current value is less than the first preset current value.

Please refer to FIG. 1. The detection circuit of the load state of the power tool of the disclosure further includes the contactor 30. The contactor 30 is connected to the driving loop 90 of the motor 200. In an embodiment, the contactor 30 is connected on a line between the positive electrode of the battery pack as the first direct current power source 100 and the positive side of the motor driving unit 50 to control the on/off connection state between the battery pack and the motor driving unit 50. The contactor 30 may be, for example, relay K1.

FIG. 2 is a schematic flowchart of the detection method of the load state of the power tool of an embodiment of the disclosure. Operations of the detection method of the load state of the power tool will be described in detail below with reference to FIG. 2.

In S10, starting the detection of the load state of the power tool.

In S20, obtaining a load current of the power tool by detecting the voltage across the sampling resistor RS1. Wherein, the voltage at both ends of the sampling resistor RS1 may be sampled by the voltage sampling unit arranged at both ends of the sampling resistor RS1. The voltage generated on the sampling resistor RS1 is amplified by the operational amplifier inside the main control unit 40 and the operational feedback amplifier circuit 80 mainly composed of the resistor R4 and the resistor R5, and then is connected to an I/O port (input or output port) of the main control unit 40 via the RC filter circuit 60 mainly composed of the resistor R6 and the capacitor C2 to be processed.

In S30, determining the load state of the power tool according to an obtained magnitude of the load current of the power tool. Please refer to the first to fourth load states above for details. When the load current of the power tool is greater than or equal to the reference current value, defining the load state of the power tool as the first load state; when the load current of the power tool is greater than or equal to 90% of the reference current value and less than the reference current value, defining the load state of the power tool as the second load state; when the load current of the power tool is greater than or equal to 80% of the reference current value and less than 90% of the reference current value, defining the load state of the power tool as the third load state; when the load current of the power tool is less than 80% of the reference current value, defining the load state of the power tool as the fourth load state.

In S40, determining duration time of the current load state of the power tool through a timer. When the duration time of the current load state of the power tool is greater than or equal to the preset time (which may be selected according to an actual situation), the alarm display unit 10 is controlled to execute the display state preset with the current load state of the power tool according to Table 1.

In S50, the light-emitting diode LED1 of the alarm display unit 10 executing a display order.

In S60, returning to S10 to continue the operation.

In summary, the power tool, the detection circuit and detection method of the load state of the power tool can intuitively remind a user of a magnitude of a load current during a use of the power tool, and maintain a consistency of the relative cutting, which improves a use of a product, enables the user to be more satisfied, and comprehensively improves a competitiveness of the power too.

In the description herein, many specific details are provided, such as examples of components and/or methods, to provide a complete understanding of the embodiments of the disclosure. However, those skilled in the art will recognize that the embodiments of the disclosure may be realized without one or more specific details or through other devices, systems, assemblies, methods, components, materials, parts, etc. In other cases, well-known structures, materials, or operations are not specifically shown or described in detail to avoid obscuring aspects of the embodiments of the disclosure.

It should also be understood that one or more of the components shown in the drawings may also be implemented in a more separate or integrated manner, or may even be removed because it cannot be operated in some cases or may be provided because it is useful according to a particular application.

In addition, unless expressly indicated otherwise, any marking arrows in the drawings should be regarded only as exemplary instead of limiting. What's more, unless specified otherwise, the term "or" as used herein generally means "and/or." In cases where the term is foreseen because it is unclear to provide separation or combination capabilities, the combination of components or operations will also be regarded as specified.

The above description of the illustrated embodiment of the disclosure (including content described in the abstract of the specification) is not intended to exhaustively enumerate or limit the disclosure to the precise form provided herein. Although specific embodiments of the disclosure and examples of the disclosure are described herein for illustrative purposes only, as those skilled in the art recognize and understand, various equivalent modifications are possible within the scope of the disclosure. As pointed out, these modifications may be made to the disclosure according to the above description of the embodiments of the disclosure, and these modifications will be within the scope of the disclosure.

This specification has generally described the system and method which are helpful in understanding the details of the disclosure. In addition, various specific details have been given to provide an overall understanding of the embodiments of the disclosure. However, those skilled in the relevant art will recognize that the embodiments of the disclosure may be realized without one or more specific details, or may be implemented through using other devices, systems, accessories, methods, assemblies, materials, parts, etc. In other cases, well-known structures, materials, and/or operations are not specifically shown or described in detail to avoid confusion in various aspects of the embodiments of the disclosure.

Therefore, although the disclosure has been described herein with reference to its specific embodiments, a freedom of modification, various changes and substitutions are also included in the above disclosure. And it should be understood that in some cases, without departing from the scope of the disclosure, some features of the disclosure will be adopted under the conditions without corresponding use of other features. Therefore, many modifications may be made to enable a specific environment or material to adapt the essential scope of the disclosure. The disclosure is not intended to limit the specific terms used in the claims and/or specific embodiments disclosed as the best embodiment for carrying out the disclosure, but the disclosure will include any and all embodiments and equivalents falling within the scope of the appended claims. Therefore, the scope of the disclosure will only be determined by the appended claims.

What is claimed is:

1. A detection circuit of a load state of a power tool, comprising:
   a main control unit, comprising an operational amplifier,
   a sampling resistor, arranged on a driving loop of a motor,
   a voltage sampling unit, configured to sample a voltage across the sampling resistor,
   an alarm display unit, connected with the main control unit,
   an RC filter circuit, one end of the RC filter circuit being connected with an I/O port of the main control unit,
   a bias circuit, connected with the main control unit, a first end of the bias circuit being connected with a positive end of the operational amplifier, and a second end of the bias circuit being connected with the sampling resistor,
   an operational feedback amplifier circuit, connected with the RC filter circuit, and
   a capacitor C3, connected between the bias circuit and the operational feedback amplifier circuit and connected with a negative end of the operational amplifier, wherein
   one end of the sampling resistor is connected with the operational feedback amplifier circuit, and the operational amplifier in sequence,
   the main control unit is configured to control the alarm display unit to execute a preset display state according to a voltage signal across the sampling resistor sampled by the voltage sampling unit.

2. The detection circuit of the load state of the power tool according to claim 1, further comprising a second direct current power source, wherein
   the second direct current power source is respectively connected with power supply terminals of the main control unit, the voltage sampling unit and the alarm display unit.

3. The detection circuit of the load state of the power tool according to claim 2, wherein
   the second direct current power source is connected with a first direct current power source, the first direct current power source is a driving power source of the power tool, and the first direct current power source is configured to supply power to the second direct current power source.

4. The detection circuit of the load state of the power tool according to claim 3, wherein
   the first direct current power source comprises a battery pack.

5. The detection circuit of the load state of the power tool according to claim 3, wherein
   one end of the sampling resistor is connected with a negative electrode of a motor driving unit, the other end of the sampling resistor is connected with a negative electrode of the first direct current power source, and a positive electrode of the motor driving unit is connected with a positive electrode of the first direct current power source.

6. The detection circuit of the load state of the power tool according to claim 3, wherein
   the voltage sampling unit comprises a resistor R2, a resistor R3, a resistor R4, a resistor R5, a resistor R6, a capacitor C2 and the capacitor C3, one end of the resistor R2 is connected with the second direct current power source, and the other end of the resistor R2 is respectively connected with a positive end of the operational amplifier, one end of the resistor R3 and one end of the capacitor C3, the other end of the resistor R3 is respectively connected with one end of the sampling resistor and a negative electrode of a motor driving unit, the other end of the capacitor C3 is respectively connected with a negative end of the operational amplifier, one end of the resistor R4 and one end of the resistor R5, the other end of the resistor R4 is respectively connected with the other end of the sampling resistor and a negative electrode of the first direct current power source, the other end of the resistor R5 is respectively connected with an output end of the operational amplifier and one end of the resistor R6, the other end of the resistor R6 is respectively connected with an input or output port of the main control unit and one end of the capacitor C2, and the other end of the capacitor C2 is grounded.

7. The detection circuit of the load state of the power tool according to claim 2, wherein
the alarm display unit comprises a resistor R1 and a light-emitting diode LED1, one end of the resistor R1 is connected with the second direct current power source, the other end of the resistor R1 is connected with an anode of the light-emitting diode LED1, and a cathode of the light-emitting diode LED1 is connected with the main control unit.

8. The detection circuit of the load state of the power tool according to claim 1, wherein
the main control unit is configured to
obtain a load current of the power tool according to the voltage signal across the sampling resistor collected by the voltage sampling unit,
determine the load state of the power tool according to an obtained magnitude of the load current of the power tool, and
determine duration time of a current load state of the power tool, when the duration time of the current load state of the power tool is greater than or equal to a preset time, controlling the alarm display unit to execute a preset display state corresponding to the current load state of the power tool.

9. A detection method of a load state of a power tool, comprising:
obtaining a load current of the power tool by detecting a voltage across a sampling resistor,
determining the load state of the power tool according to an obtained magnitude of the load current of the power tool, and
determining duration time of a current load state of the power tool, when the duration time of the current load state of the power tool is greater than or equal to a preset time, controlling an alarm display unit to execute a preset display state corresponding to the current load state of the power tool;
wherein, the power tool comprises a main control unit, an RC filter circuit and a bias circuit connected with the main control unit, an operational feedback amplifier circuit, connected with the RC filter circuit, and a capacitor C3 arranged between the bias circuit and the operational feedback amplifier circuit, a generated voltage is amplified by the main control unit and the operational feedback amplifier circuit, then is connected to an I/O port of the main control unit via the RC filter circuit to be processed.

10. The detection method of the load state of the power tool according to claim 9, wherein
a value of the load current is defined as a reference current value when the power tool is overloaded,
determining the load state of the power tool according to the obtained magnitude of the load current of the power tool comprises: determining the load state of the power tool according to a proportional range of the value of the load current of the power tool to the reference current value.

11. The detection method of the load state of the power tool according to claim 10, wherein
determining the load state of the power tool according to the proportional range of the value of the load current of the power tool to the reference current value comprises:
defining the load state of the power tool as a first load state when the value of the load current of the power tool is greater than or equal to the reference current value,
defining the load state of the power tool as a second load state when the value of the load current of the power tool is greater than or equal to a first preset current value and less than the reference current value,
defining the load state of the power tool as a third load state when the value of the load current of the power tool is greater than or equal to a second preset current value and less than the first preset current value, and
defining the load state of the power tool as a fourth load state when the value of the load current of the power tool is less than the second preset current value.

12. The detection method of the load state of the power tool according to claim 11, wherein
the first preset current value is set from 85% to 95% of the reference current value, and the second preset current value is set from 75% to 85% of the reference current value, the second preset current value is less than the first preset current value.

13. A power tool, comprising:
a body;
a motor and a motor driving unit, arranged on the body; and
a detection circuit of a load state of the power tool, arranged on the body, wherein
the detection circuit of the load state of the power tool comprises:
a main control unit, comprising an operational amplifier,
a sampling resistor, arranged on a driving loop of the motor,
a voltage sampling unit, configured to sample a voltage across the sampling resistor,
an alarm display unit, connected with the main control unit,
an RC filter circuit, one end of the RC filter circuit being connected with an I/O port of the main control unit,
a bias circuit, connected with the main control unit, a first end of the bias circuit being connected with a positive end of the operational amplifier, and a second end of the bias circuit being connected with the sampling resistor,
an operational feedback amplifier circuit, connected with the RC filter circuit, and
a capacitor C3, connected between the bias circuit and the operational feedback amplifier circuit and connected with a negative end of the operational amplifier, wherein
one end of the sampling resistor is connected with the operational feedback amplifier circuit, and the operational amplifier in sequence,
the main control unit is configured to control the alarm display unit to execute a preset display state according to a voltage signal across the sampling resistor collected by the voltage sampling unit.

14. The power tool according to claim 13, wherein
the power tool comprises a cutting saw or a chain saw.

* * * * *